US006979787B2

(12) United States Patent
Davies

(10) Patent No.: US 6,979,787 B2
(45) Date of Patent: Dec. 27, 2005

(54) ARTICLE FOR DE-ENERGIZING A BRANCH ELECTRICAL CIRCUIT, AND RELATED PROCESSES

(76) Inventor: Christopher John Davies, 18 Mechanic St., Hope Valley, RI (US) 02832

(*) Notice: Subject to any disclaimer, the term of this patent is extended or adjusted under 35 U.S.C. 154(b) by 142 days.

(21) Appl. No.: 10/790,997

(22) Filed: Mar. 1, 2004

(65) Prior Publication Data

US 2004/0246638 A1 Dec. 9, 2004

Related U.S. Application Data

(63) Continuation-in-part of application No. 10/455,205, filed on Jun. 6, 2003, now abandoned.

(51) Int. Cl.[7] .............................................. G01R 31/02

(52) U.S. Cl. .............. 200/51 R; 200/51.11; 200/51.12; 324/508; 324/509; 324/555; 324/556; 340/650

(58) Field of Search .......................... 200/5 QR, 51.05, 200/51.06, 51.11, 51.12; 324/114, 133, 156, 324/424, 508, 509, 522, 555, 556; 340/649, 340/650, 654, 656; 439/651

(56) References Cited

U.S. PATENT DOCUMENTS 4,164,702 A * 8/1979 Pereda ....................... 324/508
4,280,092 A * 7/1981 Wells et al. ................ 324/508
4,893,086 A 1/1990 Shrewsbury
4,945,346 A * 7/1990 Schmiemann ............... 340/656
5,036,214 A 7/1991 Zerillo
5,331,283 A * 7/1994 Sheldon ....................... 324/508
5,642,052 A * 6/1997 Earle ........................... 324/556
6,020,822 A * 2/2000 Marshall ...................... 340/654
6,072,317 A * 6/2000 Mackenzie .................. 324/536
6,218,844 B1 * 4/2001 Wong et al. ................ 324/509
6,731,217 B1 * 5/2004 Warner ........................ 340/650
6,734,680 B1 * 5/2004 Conard ........................ 324/509

* cited by examiner

*Primary Examiner*—Michael A. Friedhofer

(57) ABSTRACT

A device for de-energizing an energized branch electrical circuit is described, as well as related processes. The device includes a circuit breaker, which itself includes a breaker switch, an input terminal for receiving current, and an output terminal for directing current out of the breaker. A plug is also incorporated into the device, so that the device can be inserted into an electrical receptacle in the branch electric circuit. One or more power indicators, such as an LED light or voltmeter, are also incorporated into the device. When the device is plugged into a receptacle of the branch circuit, the breaker switch can then be turned on, resulting in a short-circuit, which de-energizes the branch electrical circuit. The device may also include a holder, which is capable of retaining at least one electrical adapter.

28 Claims, 5 Drawing Sheets

ARTICLE FOR DE-ENERGIZING A BRANCH ELECTRICAL CIRCUIT, AND RELATED PROCESSES

This application is a continuation-in-part application of Ser. No. 10/455,205 (Christopher J. Davies), filed on Jun. 6, 2003, now abandoned.

BACKGROUND OF THE INVENTION

This invention relates generally to electrical devices. More specifically, the invention is directed to devices which are capable of de-energizing an electrical circuit.

A typical home today is powered by an electrical system which originates in a service panel. Electricity is distributed from the service panel to a number of branch circuits. The branch circuits feed power to many switches, receptacles, fixtures, and appliances in different areas of the house. The branch circuits are attached to one or two "hot" bus bars, depending on their voltage specification. When a branch circuit is over-loaded, or when a short occurs in some part of the circuit, the associated breaker trips, thereby shutting off power, i.e., "de-energizing" the circuit. In this manner, over-heating of the wiring is prevented, and a dangerous situation is thus avoided.

When a branch circuit has to be serviced or changed, it is a safe practice to shut off the appropriate circuit breaker (or fuse) supplying power. This step can be time-consuming if the breakers in the service panel are unmarked. In many instances, the service panel is located a distance from the electrical outlet being serviced.

Furthermore, many modern houses are much larger than houses of past generations. Thus, the distance to the service panel from the work location can be greater than ever. Moreover, the larger homes are often equipped with ever-greater numbers of televisions, appliances, computers, and the like. Thus, the number of branch circuits required for the home has also increased, resulting in an even longer search for one particular, unmarked breaker.

In a typical situation, a home owner, electrician, or other worker (often working alone) would have to first go down to the service panel and shut off a circuit breaker which might be the correct choice. The individual would then walk back to the work area to determine if the correct branch circuit has been de-energized. If not, the chore will have to be repeated—perhaps several times in a large home.

Electricians and other workers sometimes attempt to manually trip the breaker at an outlet in the branch circuit, so as to avoid the walk to the service panel, and get on with the job at hand. For example, the breaker can often be tripped by sticking opposite ends of a wire into each adjacent slot of an electrical receptacle (sometimes referred to as an "outlet"). The mid-portion of the wire is covered by insulation, and is often held by pliers or a similar tool.

While the make-shift wire tool can sometimes successfully trip the breaker at an outlet, there are some considerable disadvantages to its use. For example, the wire may not be in firm, complete contact with the electrical circuit in the outlet, resulting in arcing and flashback. Very often, the flashback can damage the receptacle. For example, the receptacle face can be charred or discolored, necessitating replacement. Moreover, the underlying components in the receptacle, such as its electrical connections, can be damaged by the flashback. Furthermore, the arcing can represent a physical danger to the individual working near the outlet.

Various devices are available for measuring the electrical characteristics of a branch circuit. For example, an armature tester is described in U.S. Pat. No. 4,893,086 (Shrewsbury). The device includes a housing from which conductive probes extend, and a power source (e.g., a battery) within the housing, for providing voltage across a selected coil winding on the armature being examined. A voltmeter or similar device is provided to detect whether a selected coil is shorted, or has some other characteristic. The tester can include other features as well, such as a rheostat.

The testing device of Shrewsbury appears to be quite useful for assessing the status of an armature coil. However, such a testing device does not appear to be capable of indicating whether a branch circuit is energized, via inspection from an electrical outlet in that circuit. Moreover, the Shrewsbury device has nothing to do with de-energizing a branch electrical circuit.

A device for remotely controlling electricity from one or two electrical supply sources is described by Zerillo, in U.S. Pat. No. 5,036,214. The device includes a receiver-controlled switch mechanism, along with an electrical circuit arrangement for providing and terminating electricity to an outlet of the device. Zerillo's invention apparently permits lamps and appliances to be switched on and off from remote locations, using different power supplies. Zerillo's device includes other features as well. For example, a clock-actuated switch can be incorporated into the device.

The device described in Zerillo's patent appears to be useful for the remote control of various electric power supplies. However, such an invention does not function to measure electrical current at an electrical outlet in a branch circuit. The device also has nothing to do with de-energizing such a branch circuit.

An audible test circuit device is described by R. Brown, in U.S. Patent Application Publication 2002/0057089. The device includes a four-way bridge rectifier circuit contained within a cylindrical body. The rectifier circuit is capable of producing a DC output voltage of known polarity. The device further includes a number of prongs extending from the body, and coupled to the rectifier circuit. The body of the device includes indicator lights. These lights provide a visual indication of power applied to the rectifier circuit, while also indicating the polarity of the circuit being tested.

The test circuit device of Brown further includes an audible alarm. The alarm is also coupled to the rectifier circuit, and is activated when power is applied thereto. Moreover, Brown's device includes a lamp attachment which can be connected to the prongs. In this manner, the test circuit can be attached to a lamp socket, for testing its power and polarity.

The invention of Brown appears to be useful for analyzing a circuit, in terms of electrical power, as well as polarity. However, the Brown device is a testing device—not a device capable of de-energizing an electrical circuit. The title of the publication includes the term "circuit breaker", but this appears to be a misnomer. Nothing in the mechanism, as described, appears to indicate a circuit breaker function.

In view of the discussion above, it appears that a device which de-energizes a branch electrical circuit would be very welcome in the art. The device should be capable of de-energizing the branch circuit at different locations. For example, it would be very desirable if the device could be used at various outlets and fixtures in one or more rooms served by the circuit in a home or building. Moreover, the device should preferably be convenient and easy to use. A hand-held device would be of great interest, for example.

Furthermore, operation of the device should be very safe for the user, and should not result in damage to the electrical receptacle or any of the underlying components. A de-energizing device which was also capable of detecting whether a branch circuit was "live" or not would additionally be of great interest. Moreover, a de-energizing device which was capable of measuring the actual voltage present in a particular branch circuit would be very advantageous.

BRIEF DESCRIPTION OF THE INVENTION

In view of the needs discussed above, the present inventor has discovered a device for de-energizing a branch electrical circuit. The device comprises a circuit breaker with power input means and power output means, wherein the power input means is connected to an electrical feed blade on a plug, and the power output means is connected to an output blade or neutral blade on the plug. The device further comprises a switch for electrically activating or de-activating the breaker; and at least one power-indicating means electrically connected to the plug. Such a device is capable of short-circuiting the branch electrical circuit, if the circuit is energized, when the plug is inserted into an outlet receptacle of the branch circuit, and the switch is activated. In this manner, the branch circuit is safely and effectively de-energized.

In some specific embodiments, the device comprises a circuit breaker, which itself comprises:

(i) a breaker switch for electrically activating or de-activating the breaker;

(ii) an input terminal for receiving current into the breaker; and (iii) an output terminal for directing current out of the breaker.

The device also includes a plug, capable of insertion into an electrical receptacle in the branch electric circuit. The plug usually includes at least one electrical feed blade and at least one neutral blade. An electrical lead connects the input terminal of the circuit breaker to the electrical feed blade of the plug. Another electrical lead connects the output terminal of the circuit breaker to the neutral blade of the plug. (As used herein, the terms "receptacle", "outlet", and "outlet receptacle" are intended to embrace any type of receptacle or outlet, e.g., wall receptacles, floor receptacles, lamp receptacles, plug receptacles, cord receptacles, twist-lock receptacles, and the like).

A variety of circuit breakers can be used for the device of the present invention. As discussed in the Detailed Description, the type of breaker is determined by the branch circuit being investigated. Usually, the breaker is of the single phase or double phase type (i.e., "single-pole" or "double-pole", respectively).

As discussed below, the device further includes at least one power-indicating means (sometimes referred to as a "power indicator"), electrically connected to the plug. A variety of power indicators can be employed. Some are described in the remainder of the specification, and may include devices such as LED lights; audible signal devices, and/or electrical measuring devices such as voltmeters. The device itself is contained in a suitable housing—usually one that allows it to be used efficiently as a hand-held instrument.

In another embodiment, the device further includes a holder, which is capable of retaining and storing at least one adapter. As discussed below (and as illustrated), the holder often includes a recessed region, into which various adapters can be inserted. The adapters can be easily retracted from the holder for use, and then returned after use.

A method for de-energizing a branch electrical circuit also forms part of the present invention. The method comprises:

(I) inserting an article, capable of short-circuiting the circuit, into a receptacle of the circuit, wherein the article comprises a switch for activating or de-activating the short-circuit; said switch being set in a position to de-activate the short-circuit prior to insertion of the article into the outlet; and then (II) moving the switch to a position which activates the short-circuit, thereby de-energizing the branch electrical circuit.

Further details regarding the various features and embodiments of this invention are found in the remainder of the specification, and in the accompanying drawings.

DETAILED DESCRIPTION OF THE INVENTION

Figure 1:
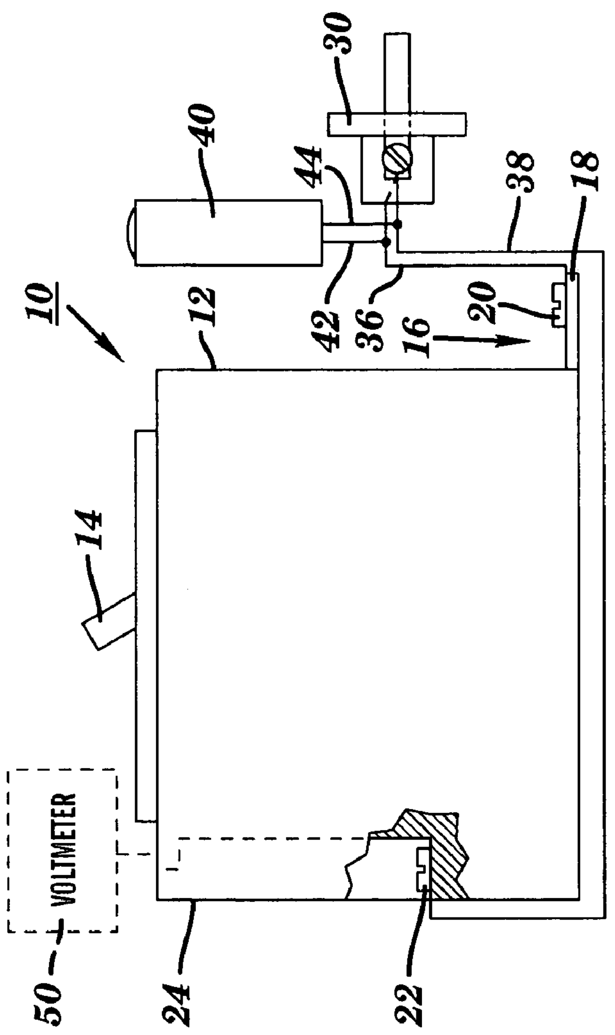
FIG. 1 is a perspective view of the device of the present invention, without its housing.
Figure 2:
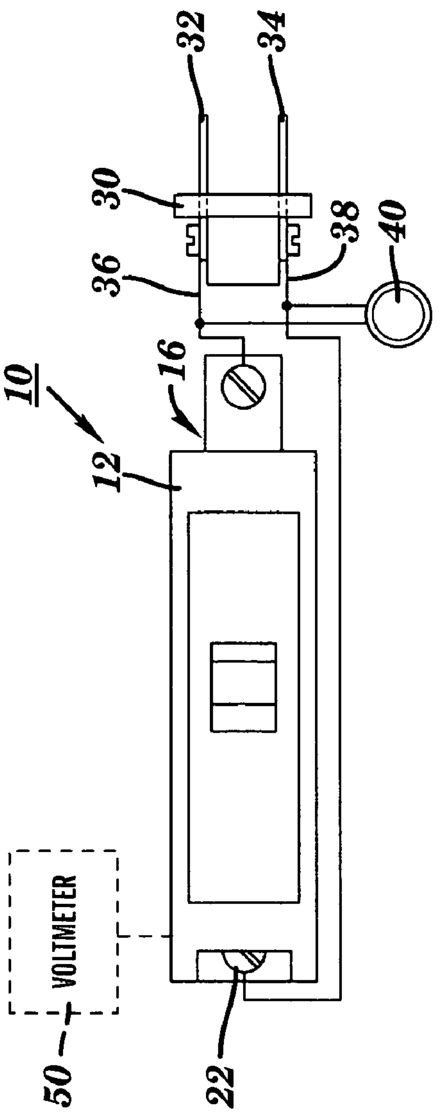
FIG. 2 is top-view of the device of FIG. 1.

FIGS. 1 and 2 are schematic representations of an embodiment of the present invention. De-energizing device 10 includes a circuit breaker 12. The invention is not limited to any particular type of circuit breaker. A large number of suitable circuit breakers are commercially available, from companies such as Square D, Siemens, Cutler Hammer, General Electric, and the like. Circuit breakers are available at many electrical supply houses, as well as retail outlets, e.g., local hardware stores, Lowes, and Home Depot.

Circuit breakers and related information regarding electrical circuits are described in many sources. Examples include "The Encyclopedia Americana", International Edition 2002, Volume 6 (p. 734) and Volume 10, (pp. 130–135) (Grolier); "Step-by-Step Wiring", Better Homes and Gardens, B. W. Allen, Editor, Meredith Corporation, 1997; "Complete Home Wiring", Edited by S. Atkinson, Sunset Publishing Company, 2000; and "Electrical Basics", R. Peters, Sterling Publishing Company, Inc. (Butterick Company) (ISBN 0-8069-3667-3), all of which are incorporated herein by reference. The following patents also provide examples of circuit breakers: U.S. Pat. Nos. 4,521,756; 4,292,612; 3,464,040; and 3,081,386, all incorporated herein by reference.

As used herein, the term "circuit breaker" is meant to include any device that interrupts electrical flow in a circuit, in the event of an electrical overload or short circuit. In general, when the circuit breaker is energized, i.e., in the "on" position, current can flow through it. Movement to the "off" position cuts off the flow of current through the circuit breaker.

The inner workings (i.e., the inner mechanism) of a circuit breaker are also well-known in the art here, and do not require a detailed depiction or description. An exemplary description is provided in the "Step-by-Step Wiring" text mentioned above, e.g., at page 61. Typically, the circuit breakers include a switch or "toggle", along with a set of contacts which are attached to a spring and lever. The contacts are held together by tension in a bimetal strip, through which current flows when the switch is on. If there is some sort of overload or short in the electrical circuit, the bimetal strip heats up and bends. The bending of the strip releases the lever, which opens the spring-loaded contact and shuts off current. The contacts remain separated until the switch is manually reset.

As shown in FIG. 1, circuit breaker 12 includes breaker switch 14. The switch electrically activates or de-activates the breaker, as alluded to above. Switch 14 is usually a toggle switch, but other types of switches could be used as well.

Circuit breaker 12 also includes input terminal 16 (i.e., "power input means"). The input terminal, common to most circuit breakers, usually includes a metal tab or flange 18, which is connected to an internal current-intake portion of the circuit breaker (not specifically shown). Flange 18 may include an aperture, in which screw 20 is retained. Screw 20 serves as a convenient fastening site for electrical leads, as described below. However, the screw is not critical, as other means of connecting the leads to flange 18, or directly to terminal 16, may also be possible, e.g., soldering techniques.

The circuit breaker further includes output terminal 22 (i.e., "power output means"). (Breaker 12 is partially cut-away in FIG. 1 to show the terminal, which is sometimes recessed within a wall section 24 of the breaker). The terminal may be in the form of a metal screw, which is connected to the inner mechanism of the breaker, as generally described above. (Those skilled in the art understand that other types of terminals might be used as well). Output terminal 22 functions to direct current out of the breaker. (It should also be noted that the input and output terminals could be located at different positions on breaker 12, e.g., they need not be positioned at opposite ends).

The rating of circuit breaker 12 depends in part on the electrical capacity of the branch circuit. For the present invention, the circuit breaker is rated to handle an electrical current value which is greater than the electrical current load carried by the branch circuit. In this manner, the device of the present invention will be effective in de-energizing the branch circuit. As an example, circuit breaker 12 is often rated for a branch circuit having a voltage value in the range of about 100 volts to about 125 volts. In that instance, the circuit breaker is usually a single-pole breaker, rated to handle an electrical current value of about 25 amps to about 35 amps. As further described below, circuit breaker 12 may alternatively be a double-pole breaker rated for a branch circuit having a voltage value in the range of about 100 volts to about 250 volts. (However, branch circuits, whether single-pole, double-pole, or triple pole, could conceivably carry voltages as low as a few millivolts, and as high as about 600 volts).

The device of this invention further comprises a plug 30, as shown in FIGS. 1 and 2. The plug is one which is capable of insertion into an electrical outlet (receptacle) of the branch electric circuit. The specific type of plug which is employed will depend in part on the electrical characteristics of the branch circuit. In the case of a standard, 120-volt branch circuit, plug 30 of the device is often a standard plug having two blades or "prongs" 32, 34, as depicted in FIG. 2. As those skilled in the art understand, one blade is usually an "electrical feed" blade, while the other is a "neutral" blade, handling the return-current. (For the purpose of the present description, blade 32 is arbitrarily designated the feed blade, while blade 34 is designated as the neutral blade). Plug 30 can be polarized, i.e., with one blade wider than the other. Moreover, a variety of types of standard plugs may be employed. Non-limiting examples include round-cord plugs, flat-cord plugs, quick-connect plugs, and twist-lock plugs. In the case of 240-volt branch circuit (e.g., one used for heavier appliances), plug 30 is preferably a three-prong grounding plug, or a standard "grounded and polarized" plug, as further discussed below.

Electrical lead 36 connects input terminal 16 of the circuit breaker to feed blade 32 of the plug. Electrical lead 38 connects output terminal 22 of the circuit breaker to neutral blade 34 of the plug. Each lead is formed from conventional wire (usually copper), which is generally covered with an insulating jacket. The gauge of the wire will depend in part on the branch circuit for which the invention is used. Usually (but not always), the wire gauge ranges from about 4 to about 10. The insulation on the ends of the wire can be stripped off, so that the wire can be wrapped around a screw on each terminal. Other fastening means are also possible.

As shown in FIGS. 1 and 2, the de-energizing device of the present invention further comprises at least one power-indicating means 40. The power indicating means ("power indicator") is activated by an energized condition in the electrical branch circuit. In other words, the power indicator is capable of detecting power (e.g., voltage) in the branch circuit, and emitting some sort of signal to alert an individual to the presence of that power. Power indicating means 40 can be electrically connected within device 10 by conventional means, e.g., leads 42 and 44 connected to leads 36 and 38, respectively, as shown in FIG. 1.

Power indicating means 40 can comprise a number of different types of devices. For example, the power indicator can be some form of light device which is activated by the energized condition. An incandescent bulb (usually relatively small) would be suitable. Alternatively, an LED light is often preferred. Multiple lights might sometimes be used.

The power indicator 40 could alternatively be an audible device. Such a device is capable of emitting a recognizable sound when activated by the energized condition in the branch circuit. A number of different types of audible devices are known in the art. Non-limiting examples include buzzers, whistles, alarms, bells, tone-generating devices, and the like. Selection of a particular device will depend on various factors, such as the type of audible signal desired, and the amount of power needed to activate the device.

The power indicator 40 could also be some sort of electrical tester, e.g., a circuit tester. The testers are well-known in the art, and commercially available. They measure one or more electrical properties of a branch circuit, e.g., voltage or current. Many of the testers are described in the references listed previously. Non-limiting examples include a voltmeter; an analog multimeter; a digital multimeter, an electrical probe; a neon tester; a polarity tester; and a receptacle analyzer. Combinations of one or more electrical testers are also possible.

In some preferred embodiments, the tester is a voltmeter. These types of devices are capable of measuring a wide range of voltage. For example, they can measure very small voltages, e.g., several millivolts. This characteristic is sometimes very useful, because it allows the device of the present invention to determine whether a small amount of voltage is present in the branch circuit. (A small electrical current may not be sufficient to allow device 10 to short-circuit the branch circuit, but knowing that some voltage is present in the circuit can be important).

Figure 3:
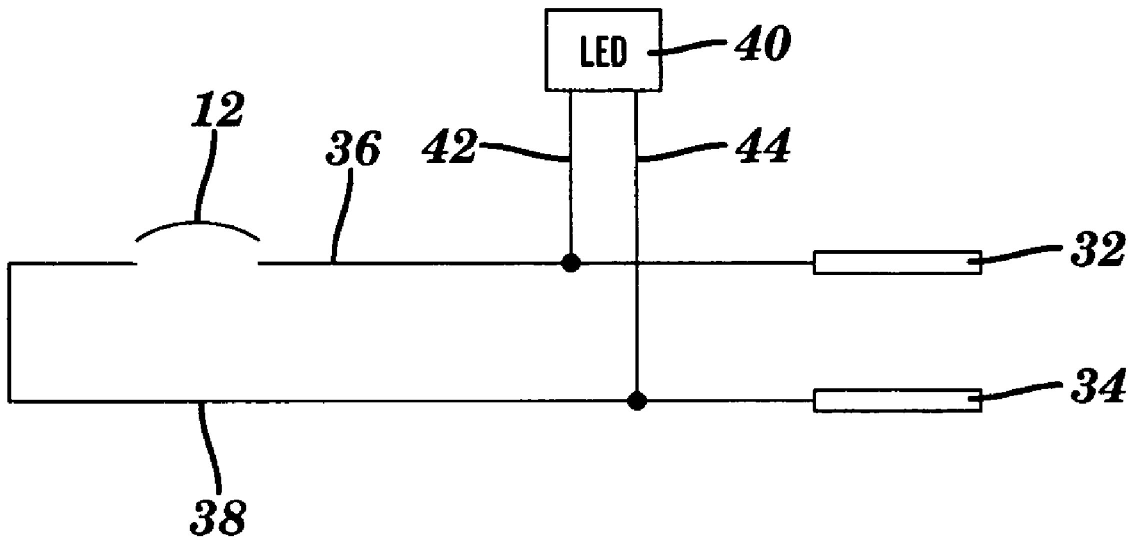
FIG. 3 is a schematic diagram showing the circuitry for one embodiment of the invention.

FIG. 3 is a simplified wiring diagram for one embodiment of the invention. Circuit breaker 12 (its input terminal) is connected to plug blade 32, the feed blade, by lead 36. The output terminal of the circuit breaker is connected to neutral blade 34 by way of electrical lead 38. Power indicator 40, exemplified by an LED light, is connected to the wiring circuit by way of leads 42 and 44.

It is sometimes preferable that at least two power indicators be incorporated into the device. As an example, the device could include both a light device and an electrical tester. With reference to FIGS. 1 and 2, indicating means 40 could represent an LED light, while indicating means 50 (shown in phantom) could represent a voltmeter. Each power indicator would be connected to electrical leads 36 and 38 in conventional fashion. Moreover, the position of each device is not critical. For example, an LED light and a voltmeter could be attached to various portions of leads 36 and 38. (Electrical testers are also described in the Brown patent application mentioned above, U.S. 2002/0057089, which is incorporated herein by reference).

One advantage of having two power indicators is that one may detect voltage values too small for the other to detect. Thus, in the illustration above, the LED light may not be activated, or may be too dim to see, at voltages less than about 100 volts. However, the voltmeter will detect such voltages.

Figure 4:
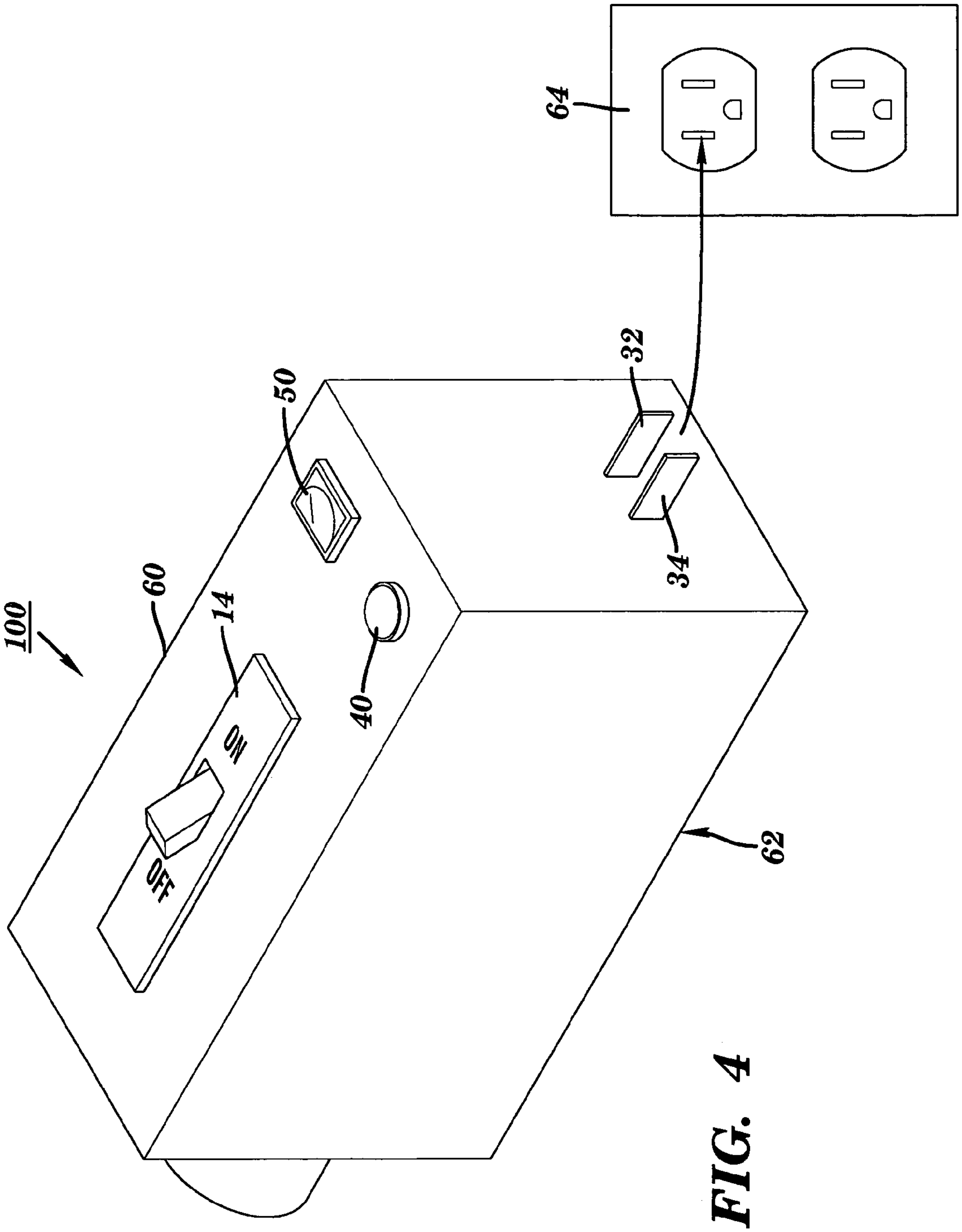
FIG. 4 is a perspective view of the device of the present invention, including a housing.

Circuit breaker 12 is usually substantially enclosed in housing 60, depicted in FIG. 4. The shape of the housing depends in part on the shape and dimensions of the circuit breaker, and is not critical to the invention. While an oblong shape is depicted in FIG. 4, the shape could alternatively be cubical or perhaps spherical (or some irregular shape), as long as it can accommodate the breaker. The housing includes appropriate apertures, e.g., for switch 14, indicator 40 and indicator 50 (if present), and for plug blades 32 and 34. The indicators can be emplaced within the housing in any convenient manner. For example, the base portion of an indicator (e.g., an LED light) could be attached by various techniques (e.g. mechanical or adhesive) to the circuit breaker itself, or to some portion of any inner surface of the housing.

In preferred embodiments, the shape of housing 60 is one which allows the device to be used in hand-held fashion. For example, the operator can easily and securely support the bottom surface 62 of the housing with one hand, while guiding plug blades 32, 34 into one set of slots in receptacle outlet 64 (e.g., a wall outlet). The other hand can be used to balance the device and/or operate switch 14. (Hand-held devices according to this invention usually weigh less than about 3 pounds, and preferably, less than about 2 pounds).

The housing can be made from a variety of different materials. Preferably, the material is electrically non-conductive. Non-limiting examples of suitable materials include plastic, rubber, fiberglass-containing resins; and composite materials. Combinations of one or more of these materials might also be used. The circuit breaker can be emplaced within the housing by any suitable means, e.g., mechanical or adhesive-attachment to one or more interior surfaces of the housing. Moreover, the inner mechanism of the circuit breaker, without the circuit breaker housing itself, could be directly incorporated into the housing of the device.

As an example of the use of this invention, device 100 (FIG. 4) can be inserted into an electrical outlet (e.g., wall outlet 64), which is connected to the branch circuit being evaluated. The plug blades 32, 34 are inserted into one of the two receptacles of the wall outlet. Switch 14 is maintained in the OFF position, so that the circuit breaker within device 14 will not allow current to pass through in a complete circuit.

Upon insertion of device 100 into outlet 64, indicator 40, e.g., an LED light, will be activated if there is sufficient power in the electrical branch circuit. Moreover, the optional, second indicator 50, e.g., a voltmeter, will indicate how much power is present in the branch circuit.

If there is power in the branch circuit, switch 14 (FIG. 4) is then turned to the ON position by the operator, allowing current to pass through the circuit breaker contained in the device, along the circuit pathway depicted in FIG. 3. This pathway or "loop" creates a short-circuit condition. The short-circuit condition immediately de-energizes the branch circuit to which outlet 64 is connected. Inspection of the service panel in the home or building will quickly reveal the tripped breaker.

In some instances, the branch circuit being investigated is a 240-volt branch circuit, sometimes referred to as a "250-volt" branch circuit. (Many of these types of circuits include a third, neutral wire, in addition to the two hot wires). They are sometimes referred to as "120/240-volt circuits" or "125/250-volt circuits". These branch circuits are typically used for larger appliances, e.g., heating systems, electric ranges, and the like. When such circuits are being examined according to the present invention, the circuit breaker is preferably a double-pole or "two-phase" breaker.

Double-pole breakers are known in the art and commercially available. They are described in many references, including some of the ones referenced previously. (See, for example, page 172 of the "Complete Home Wiring" text (Sunset); page 46 of the "Electrical Basics" text (Sterling); and page 107 of the "Step-by-Step Wiring" text (Better Homes and Gardens). The 240-volt circuit breakers (now often referred to as "250-volt") are often rated from 15 amps up to about 200 amps. The double-pole breaker employed in the device of the present invention is typically used for a branch circuit having a voltage value in the range of about 100 volts to about 250 volts. However, it could be used for a branch circuit carrying as little as about several millivolts (0.001 volts), or carrying up to about 600 volts.

Figure 5:
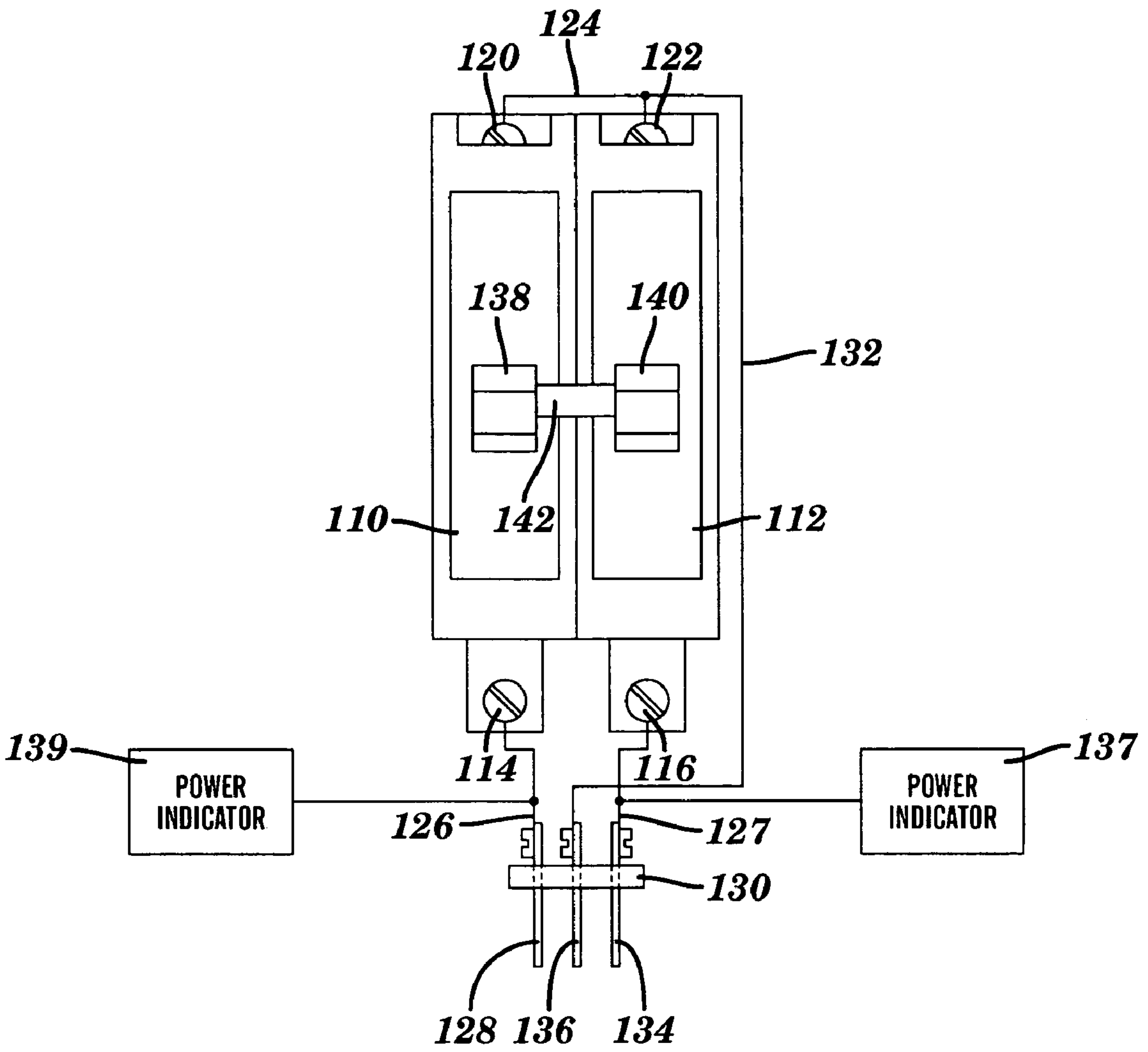
FIG. 5 is a perspective, top-view of another device according to the present invention, without its housing.

The double-pole breaker operates on the same principle as a single pole breaker. However, a double-pole breaker suitable for the present invention can also be easily fabricated. FIG. 5 is an exemplary double-pole breaker, depicted in simplified form. Single-pole breakers 110, 112 are attached together by conventional techniques, e.g., riveting, and the like. (The breakers need not be in direct contact with each other). Input terminal 114 is connected to feed ("hot") blade 128 of plug 130, via wire or lead 126. Input terminal 116 is connected to feed ("hot") blade 134, via wire or lead 127. Output terminals 120 and 122 can be connected by jumper wire 124. (Other types of electrical connection schemes may also be possible).

With continued reference to FIG. 5, it can be seen that electrical lead 132, which may be attached to either terminal 120 or 122, is attached at its other end to neutral blade 136 of the plug. Plug 130 may be of a variety of types, depending in part on the outlet receptacles in the branch circuit.

Other plugs may include three standard blades, in a variety of configurations, e.g., as in the case of plugs for 30-amp, 240-volt appliances. (Some plugs may in fact include four or more blades). Those skilled in the art are familiar with all of these types of plugs. Moreover, published guides are available, (e.g., from the National Electrical Manufacturers Association (NEMA) and/or the American National Standards Institute (ANSI)). These describe a variety of outlet/receptacle configurations, as well as related information on electrical standards. ("The National Electrical Code Handbook" (NEC), 9th edition, 2002, published by the National Fire Protection Association, is also instructive). The configuration depicted in FIG. 5 can be readily modified to accommodate a particular type of plug, without undue effort.

Figure 6:
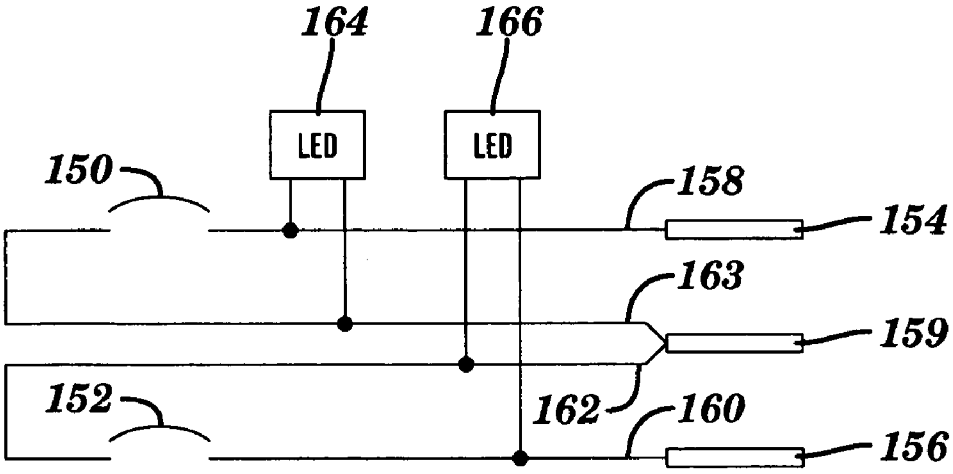
FIG. 6 is a schematic diagram showing the circuitry for another embodiment of the invention.

In preferred embodiments, the device of FIG. 5 will include an indicator for each of the phases, e.g., for each electrical lead 126 and 127. In this manner, voltage in each phase can be independently detected. The indicators are generally depicted as elements 137 and 139. They would often be lights, e.g., LED lights, but could be any of the other indicator means mentioned above. Moreover, the device could include more than one indicator for each phase. Those of ordinary skill in the art can select a specific connection mechanism for linking the indicators to the electrical leads. (The connection is simplified in FIG. 5. FIG. 6, described below, provides a helpful description for this type of situation).

The double-pole breaker will usually be contained in a housing similar to that depicted in FIG. 4, designed to accommodate the size of the breaker. As those skilled in the electrical arts understand, individual switches 138, 140 can be attached to each other to function as a single switch. For example, they could be attached with a connection bar or bracket 142. However, other types of switches are also possible. For example, the switches (usually plastic) could be molded as a single switch. Moreover, as in the case of a single pole breaker, individual breaker housings may not be necessary, as the inner mechanisms of the breakers could be assembled within the housing device.

FIG. 6 is a simplified wiring diagram for an exemplary embodiment using the double-pole breaker. Single pole breakers 150 and 152 are connected to feed blades 154 and 156, via electrical leads 158 and 160, respectively. Breakers 150 and 152 are also connected to a neutral blade 159, via electrical leads 163 and 162, respectively. Power indicator 164, exemplified by an LED light, is connected to leads 158 and 163, as shown. Power indicator 166, also exemplified by an LED light, is connected to leads 160 and 162. Additional power indicators, such as a voltmeter, would be connected in similar fashion.

In other instances, the branch circuit being investigated is carrying greater voltage than a typical two-phase circuit. In restaurants and industrial facilities, for example, circuits often carry up to about 600 volts. Three-phase circuits are often used in that instance. Consequently, the device of the present invention would include a triple-pole circuit breaker. The electrical connection of this type of breaker to an appropriate plug would be made according to common electrical standards, and analogous to the breaker connections described previously. Power indicators would usually be attached to each of the three phases.

Figure 7:
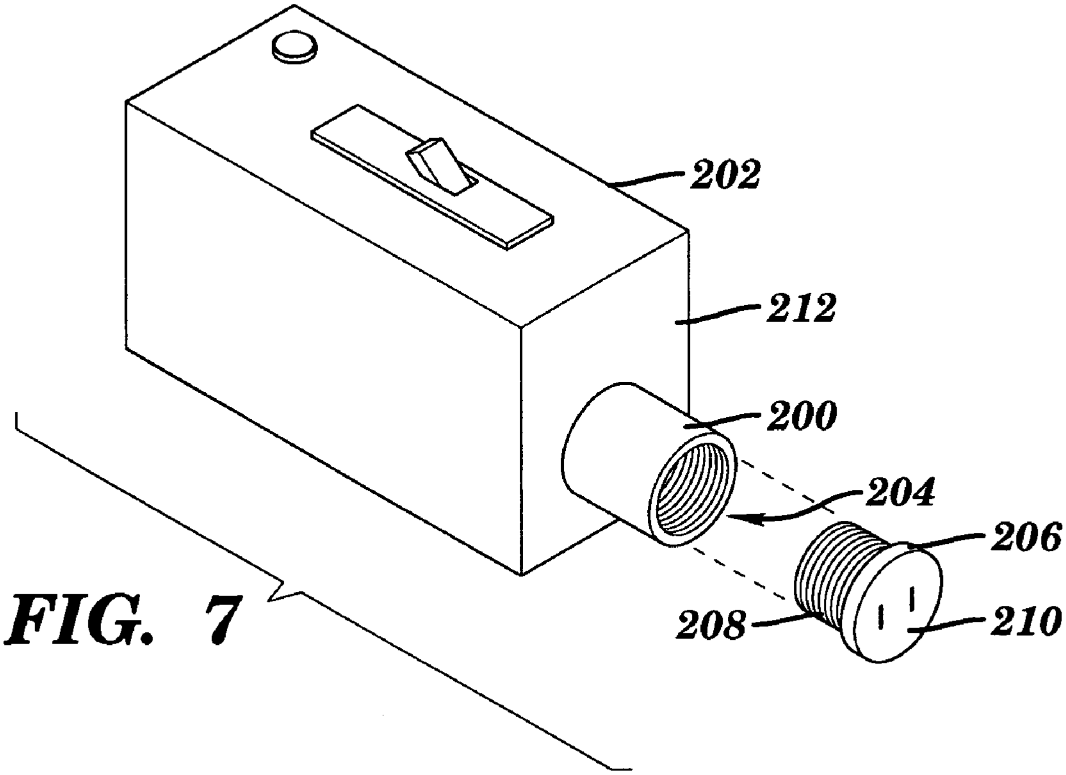
FIG. 7 is a perspective view of another embodiment for the device of the present invention.

In some embodiments, the device of the present invention includes a holder, capable of retaining at least one adapter. FIG. 7 depicts an exemplary holder 200, attached to housing 202. The holder can retain a variety of adapters (e.g., those shown in the referenced Brown patent application, U.S. 2002/0057089). Its shape and that of retaining region 204 (e.g., a recessed area) will depend in part on the type of adapter. (Other features in this figure are similar to those in the other embodiments, and need not be described again. For example, a breaker switch and LED light bulb are shown.)

In this non-limiting example, adapter 206 includes a threaded end 208, and a receptacle surface 210. (Surface 210 can contain a variety of slot configurations). Such an adapter is sometimes referred to as a lamp socket attachment, a light bulb adapter, or a "screw shell-to-plug adapter". It is useful for a variety of electrical connections. For example, it is sometimes necessary to evaluate and de-energize a branch circuit which powers overhead lights in a room. Such lights are often incandescent bulbs. In this situation, one can remove the incandescent bulb from its socket in the overhead light, and screw in end 208 of adapter 206. Receptacle surface 210 (i.e., the receptacle slots contained therein) then serves as the outlet for the device of the present invention, as described previously. As an alternative, holder 200 could be designed to accommodate adapters by way of other types of retaining mechanisms, e.g., spring-loaded clips.

Holder 200 can be formed of a variety of materials, e.g., those from which housing 202 is formed. The holder can be attached to any surface of the housing, depending in part on handling convenience for the overall device. In this illustration, the holder is attached to front surface 212 of the housing. A variety of suitable techniques for attaching the holder are possible. For example, it could be mechanically attached, e.g., with screws, bolts or brackets. Alternatively, it could be attached with an adhesive. As yet another alternative, holder 200 can be fabricated as part of housing 202. For example, if the housing were molded from a synthetic material such as plastic, the holder could be molded in one piece with the housing. Those skilled in the art are familiar with suitable molding techniques for this purpose.

Another embodiment of this invention is directed to a method for de-energizing a branch electrical circuit, as mentioned above. The method includes the step of inserting the device of the present invention into a receptacle outlet of the branch circuit. As described previously, the device is capable of short-circuiting the circuit.

The device is maintained in an inactivated state (i.e., in the OFF position) while being inserted. After insertion, it is activated, e.g., by turning switch 14 (FIG. 1, FIG. 4) to the ON position. Activation of the switch results in the short-circuit, as described above. The short circuit de-energizes the branch circuit, without damage to the receptacle outlet. Moreover an individual can then safely work on the branch circuit, and can quickly identify the corresponding circuit breaker (now tripped) in the service panel.

Having described some preferred embodiments of the present invention, alternative embodiments may become apparent to those skilled in the art, without departing from the spirit of this invention. Accordingly, it is understood that the scope of this invention is to be limited only by the appended claims.

All of the patents, articles, and texts mentioned above are incorporated herein by reference.

What is claimed:

1. An article for de-energizing a branch electrical circuit, comprising:

(a) a circuit breaker, which comprises:

(i) a breaker switch for electrically activating or deactivating the breaker;

(ii) an input terminal for receiving current into the breaker; and (iii) an output terminal for directing current out of the breaker;

(b) a plug, capable of insertion into an electrical receptacle in the branch electric circuit; and comprising at least one electrical feed blade and at least one neutral blade;

(c) an electrical lead for connecting the input terminal of the circuit breaker to the electrical feed blade of the plug;

(d) an electrical lead for connecting the output terminal of the circuit breaker to the neutral blade of the plug; and (e) at least one power-indicating means electrically connected to the plug;

wherein the circuit breaker is capable of short-circuiting the branch electrical circuit, if the circuit is energized, when the plug is inserted into the electrical receptacle and the breaker switch is activated, thereby de-energizing the branch circuit.

2. The article of claim 1, wherein the at least one power-indicating means is a light device which is activated by an energized condition in the branch circuit.

3. The article of claim 2, wherein the light device is an LED device.

4. The article of claim 1, wherein the at least one indicating means is an audible device capable of emitting a recognizable sound when activated by an energized condition in the branch circuit.

5. The article of claim 4, wherein the audible device is selected from the group consisting of buzzers, whistles, alarms, bells; tone-generating devices, and combinations of any of the foregoing.

6. The article of claim 1, wherein the at least one indicating means is an electrical tester capable of measuring at least one electrical property of the branch circuit.

7. The article of claim 6, wherein the electrical tester is selected from the group consisting of a voltmeter; an analog multimeter; a digital multimeter, an electrical probe; a neon tester; a receptacle analyzer; a circuit tester, a polarity tester, and combinations thereof.

8. The article of claim 1, wherein the branch electrical circuit is capable of carrying an electrical current load, and the circuit breaker is one which is rated to handle an electrical current value which is greater than the electrical current load carried by the branch electrical circuit.

9. The article of claim 8, wherein the circuit breaker is rated to handle an electrical current value of about 25 amps to about 35 amps.

10. The article of claim 1, wherein the circuit breaker is a single-pole circuit breaker rated for the branch circuit having a voltage value in the range of about 0.001 volt to about 600 volts.

11. The article of claim 1, wherein element (a) is double-pole breaker rated for a branch circuit having a voltage value in the range of about 0.001 volt to about 600 volts.

12. The article of claim 11, wherein the double-pole breaker comprises two single-pole breakers electrically connected to each other.

13. The article of claim 12, comprising at least two power indicating means, each connected electrically to one of the single-pole breakers.

14. The article of claim 1, wherein the circuit breaker is a triple-pole breaker rated for the branch circuit having a voltage value in the range of about 0.001 volt to about 600 volts.

15. The article of claim 1, wherein the circuit breaker is substantially enclosed in a housing.

16. The article of claim 15, wherein the housing comprises a material which is electrically non-conductive.

17. The article of claim 15, wherein the housing comprises a material selected from the group consisting of plastic, rubber, fiberglass-containing resins; composite materials; and combinations thereof.

18. The article of claim 15, further comprising a holder attached to a surface of the housing, said holder being capable of retaining at least one adapter.

19. The article of claim 18, wherein the holder comprises a recessed area which includes internal threads, and the internal threads match external threads which are located on a surface of the adapter.

20. The article of claim 18, wherein the adapter is a screw shell-to-plug adapter.

21. The article of claim 18, wherein the holder is molded to the housing.

22. An article for de-energizing a branch electrical circuit, comprising a circuit breaker with power input means and power output means, wherein the power input means is connected to an electrical feed blade on a plug, and the power output means is connected to an output blade or neutral blade on the plug, said article further comprising a switch for electrically activating or de-activating the breaker; and at least one power-indicating means electrically connected to the plug, wherein the article is capable of short-circuiting the branch circuit, if the circuit is energized, when the plug is inserted into an outlet receptacle of the branch circuit and the switch is activated, thereby de-energizing the branch circuit.

23. A method for de-energizing an energized branch electrical circuit, comprising the following steps:

(I) inserting an article capable of short-circuiting the branch electrical circuit into an outlet receptacle of the circuit, wherein the article comprises a switch for activating or de-activating the short-circuit; said switch being set in a position which does not activate the short-circuit prior to insertion of the article into the receptacle; and then (II) moving the switch to a position which activates the short-circuit, thereby de-energizing the branch electrical circuit.

24. The method of claim 23, wherein the article comprises:

(a) a circuit breaker, which comprises:
 (i) a breaker switch for electrically activating or de-activating the breaker;
 (ii) an input terminal for receiving current into the breaker; and
 (iii) an output terminal for directing current out of the breaker;

(b) a plug, capable of insertion into an electrical receptacle in the branch electric circuit; and comprising at least one electrical feed blade and at least one neutral blade;

(c) an electrical lead for connecting the input terminal of the circuit breaker to the electrical feed blade of the plug;

(d) an electrical lead for connecting the output terminal of the circuit breaker to the neutral blade of the plug; and (e) at least one power-indicating means electrically connected to the plug.

25. The method of claim 23, wherein the article is hand-held.

26. The method of claim 23, further comprising the step of determining if there is power in the branch electrical circuit prior to step (II), by observing an indication from the power-indicating means.

27. The method of claim 26, wherein the power-indicating means is selected from the group consisting of light devices, audible devices, electrical tester devices, and combinations thereof.

28. The method of claim 23, wherein the branch electrical circuit is a 120-volt branch circuit or a 250-volt branch circuit.

* * * * *